US009030341B2

(12) United States Patent
Tan et al.

(10) Patent No.: US 9,030,341 B2
(45) Date of Patent: May 12, 2015

(54) COMPENSATION FOR LANE IMBALANCE IN A MULTI-LANE ANALOG-TO-DIGITAL CONVERTER (ADC)

(75) Inventors: Loke Tan, Newport Coast, CA (US); Steven Jaffe, Irvine, CA (US); Hong Liu, Irvine, CA (US); Lin He, Irvine, CA (US); Randall Perlow, San Clemente, CA (US); Peter Cangiane, Hermosa Beach, CA (US); Ramon Gomez, San Juan Capistrano, CA (US); Giuseppe Cusmai, Mission Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/553,017

(22) Filed: Jul. 19, 2012

(65) Prior Publication Data

US 2014/0002284 A1    Jan. 2, 2014

Related U.S. Application Data

(60) Provisional application No. 61/664,858, filed on Jun. 27, 2012.

(51) Int. Cl.
*H03M 1/10* (2006.01)
*H03M 1/12* (2006.01)

(52) U.S. Cl.
CPC .......... *H03M 1/1052* (2013.01); *H03M 1/1215* (2013.01)

(58) Field of Classification Search
CPC ... H03M 1/1215; H03M 1/1009; H03M 1/12; H03M 1/0836; H03M 1/0626; H03M 1/10; H03M 1/00; H03M 1/0607; H03M 1/1057; H03M 1/1071; H03M 3/468

USPC .......... 341/118, 120, 155, 141, 159
See application file for complete search history.

(56) References Cited

U.S. PATENT DOCUMENTS 6,081,215 A * 6/2000 Kost et al. ............ 341/120
6,339,390 B1 * 1/2002 Velazquez et al. ........ 341/120
(Continued)

OTHER PUBLICATIONS

El-Chammas et al., "A 12-GS/s 81-mW 5-bit Time-Interleaved Flash ADC With Background Timing Skew Calibration," *IEEE Journal of Solid State Circuit*, vol. 46, No. 4 (Apr. 2011); 10 pages.
(Continued)

*Primary Examiner* — Linh Nguyen
(74) *Attorney, Agent, or Firm* — Sterne, Kessler, Goldstein & Fox P.L.L.C.

(57) ABSTRACT

Various multi-lane ADCs are disclosed that substantially compensate for impairments present within various signals that result from various impairments, such as phase offset, amplitude offset, and/or DC offset to provide some examples, such that their respective digital output samples accurately represent their respective analog inputs. Generally, the various multi-lane ADCs determine various statistical relationships, such as various correlations to provide an example, between these various signals and various known calibration signals to quantify the phase offset, amplitude offset, and/or DC offset that may be present within the various signals. The various multi-lane ADCs adjust the various signals to substantially compensate for the phase offset, amplitude offset, and/or DC offset based upon these various statistical relationships such that their respective digital output samples accurately represent their respective analog inputs.

27 Claims, 7 Drawing Sheets

(56) References Cited

U.S. PATENT DOCUMENTS

| | | | |
|---|---|---|---|
| 7,161,514 B2* | 1/2007 | Tamba | 341/120 |
| 7,250,885 B1* | 7/2007 | Nairn | 341/141 |
| 7,301,486 B2* | 11/2007 | Wang et al. | 341/118 |
| 7,394,415 B2* | 7/2008 | Fuse et al. | 341/120 |
| 7,525,470 B2 | 4/2009 | Parthasarthy et al. | 341/156 |
| 7,782,235 B1* | 8/2010 | Velazquez | 341/118 |
| 7,889,111 B2 | 2/2011 | Kawahito | |
| 7,948,409 B2* | 5/2011 | Wu et al. | 341/120 |
| 7,961,123 B2* | 6/2011 | Nagarajan et al. | 341/118 |
| 8,102,289 B2 | 1/2012 | Oshima et al. | |
| 8,519,875 B2* | 8/2013 | Straayer et al. | 341/120 |
| 8,564,462 B2 | 10/2013 | Gomez et al. | |
| 8,576,102 B2* | 11/2013 | Debnath et al. | 341/120 |
| 8,587,460 B2* | 11/2013 | Noguchi et al. | 341/118 |
| 2004/0086137 A1 | 5/2004 | Yu et al. | |
| 2007/0069937 A1* | 3/2007 | Balakrishnan et al. | 341/161 |
| 2007/0171116 A1* | 7/2007 | Fuse et al. | 341/161 |
| 2008/0024338 A1* | 1/2008 | Huang et al. | 341/120 |
| 2008/0030387 A1* | 2/2008 | Sheng et al. | 341/120 |
| 2010/0117878 A1* | 5/2010 | Sheng et al. | 341/120 |
| 2010/0253557 A1* | 10/2010 | Kidambi | 341/118 |
| 2011/0001645 A1* | 1/2011 | Messier et al. | 341/120 |
| 2011/0128171 A1* | 6/2011 | Oshima et al. | 341/120 |
| 2011/0193732 A1* | 8/2011 | Sestok et al. | 341/118 |
| 2012/0050079 A1* | 3/2012 | Goldman et al. | 341/118 |
| 2012/0235841 A1* | 9/2012 | Gomez et al. | 341/118 |
| 2012/0262318 A1* | 10/2012 | Straayer et al. | 341/120 |
| 2013/0106632 A1* | 5/2013 | Petigny et al. | 341/120 |
| 2013/0314261 A1 | 11/2013 | Gomez et al. | |

OTHER PUBLICATIONS

Korean office action directed to related KR application No. 10-2013-0071618, dated Jul. 8, 2014, from the Korean Intellectual Property Office; 6 pages.

US 8,427,349, 04/2013, Gomez et al. (withdrawn)

* cited by examiner

US 9,030,341 B2

COMPENSATION FOR LANE IMBALANCE IN A MULTI-LANE ANALOG-TO-DIGITAL CONVERTER (ADC)

CROSS-REFERENCE TO RELATED APPLICATIONS

The present application claims the benefit of U.S. Provisional Patent Appl. No. 61/664,858, filed Jun. 27, 2012, which is incorporated herein by reference in its entirety.

BACKGROUND

1. Field of Disclosure

The disclosure relates to analog to digital conversion, and more specifically, compensation for various impairments among multiples lanes of a multi-lane analog-to-digital converter (ADC).

2. Related Art

Data converters are frequently used in mixed-signal electronic systems. Mixed signal electronic systems include both analog signal domains and digital signal domains. The analog signal domains primarily operate upon analog signals while the digital signal domains primarily operate upon digital signals. A mechanism is required to transport signals from one domain, such as the analog signal domain, to another domain, such as the digital signal domain. Commonly, an analog-to-digital converter (ADC) is used to convert analog signals from the analog signal domain to digital signals for the digital signal domain.

A conventional multi-lane ADC utilizes multiple phases of a sampling clock to sample analog signals at different instances in time, converts these samples from the analog signal domain to the digital signal domain, and recombines these digital samples to produce digital signals. Typically, the conventional multi-lane ADC includes multiple ADCs, also referred to multiple lanes, to sample and convert the analog signals from the analog signal domain to the digital signal domain. The multiple ADCs collectively sample the analog signals, staggered in time, each at a slower rate than the Nyquist frequency of the analog signals, but collectively at a rate equal or surpassing the Nyquist frequency.

However, impairments within the conventional multi-lane ADC may cause impairments, such as amplitude offsets, direct current (DC) offsets, and/or phase offsets to provide some examples, within various signals of the conventional multi-lane that can cause the digital signals to no longer accurately represent the analog signals. The impairments may result from unknown offsets between the multiple phases of the sampling clock, linear imperfections within various lanes from among the multi-lanes of the conventional multi-lane ADC, DC offsets between the various lanes, and/or amplitude offsets between the various lanes, to provide some examples.

BRIEF DESCRIPTION OF THE DRAWINGS/FIGURES

Embodiments of the disclosure are described with reference to the accompanying drawings. In the drawings, like reference numbers indicate identical or functionally similar elements. Additionally, the left most digit(s) of a reference number identifies the drawing in which the reference number first appears.

Figure 3A:
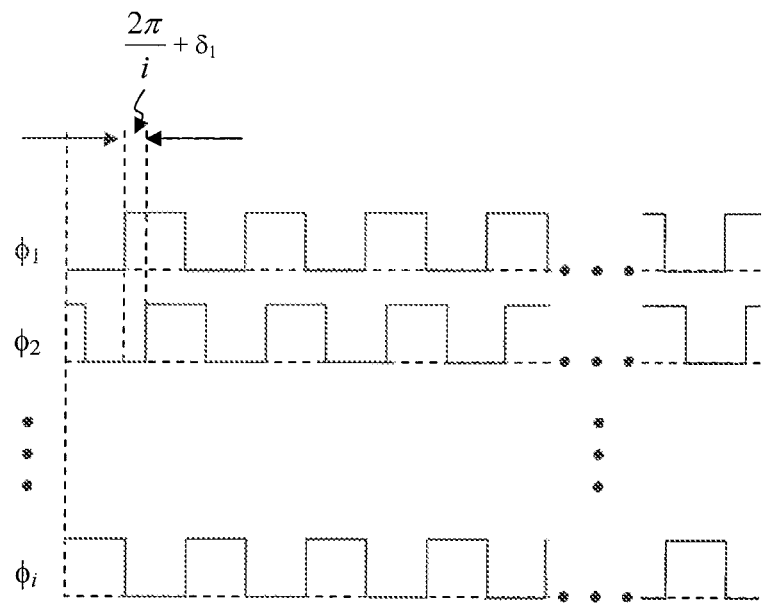
Figure 3B:
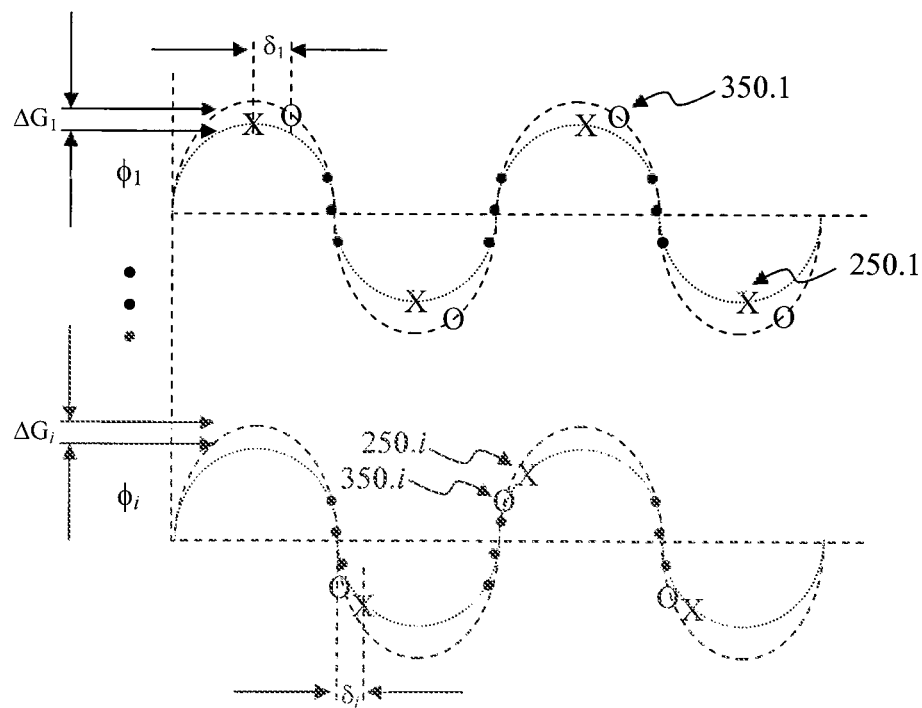
Figure 4:
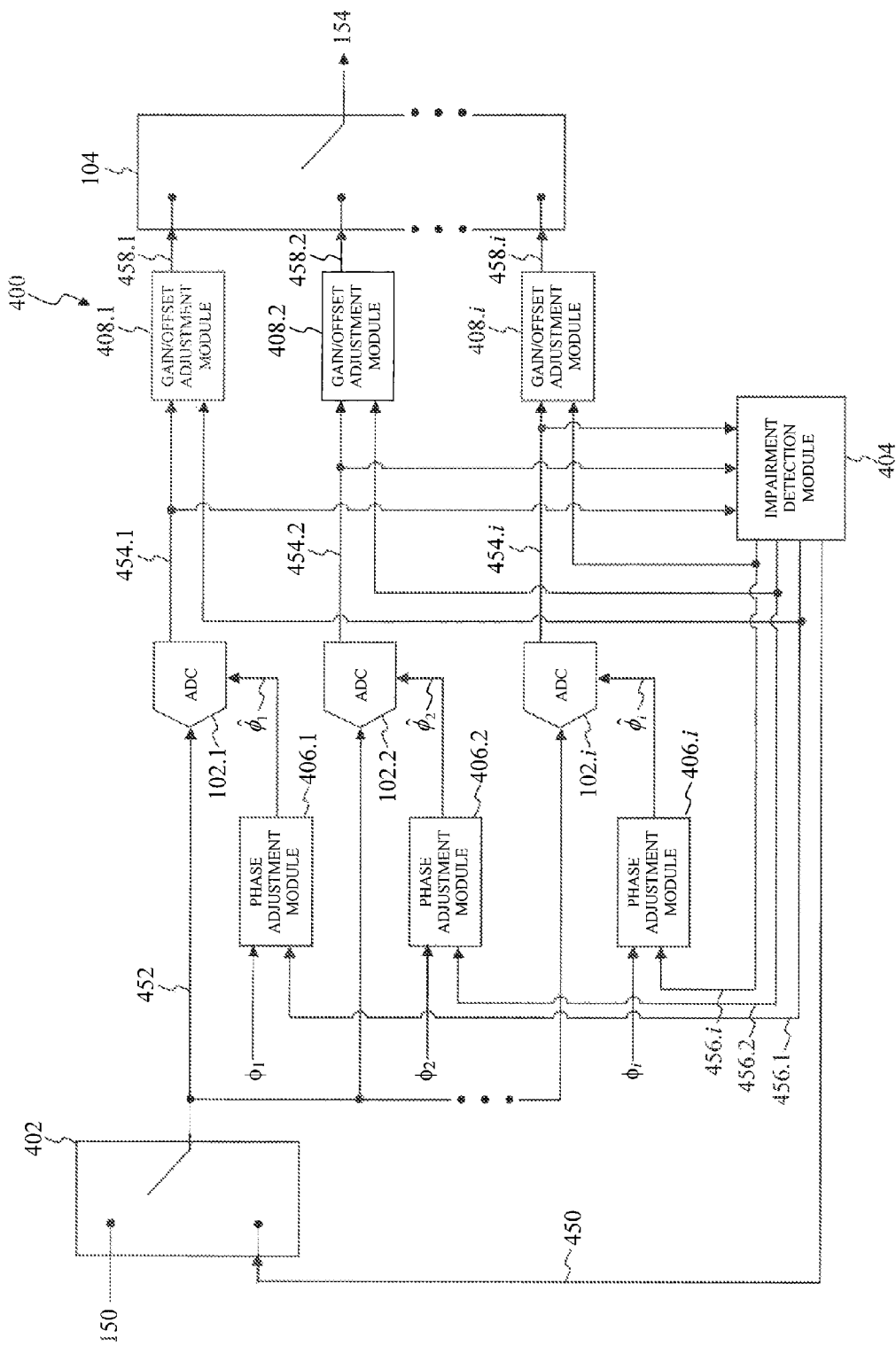
Figure 5:
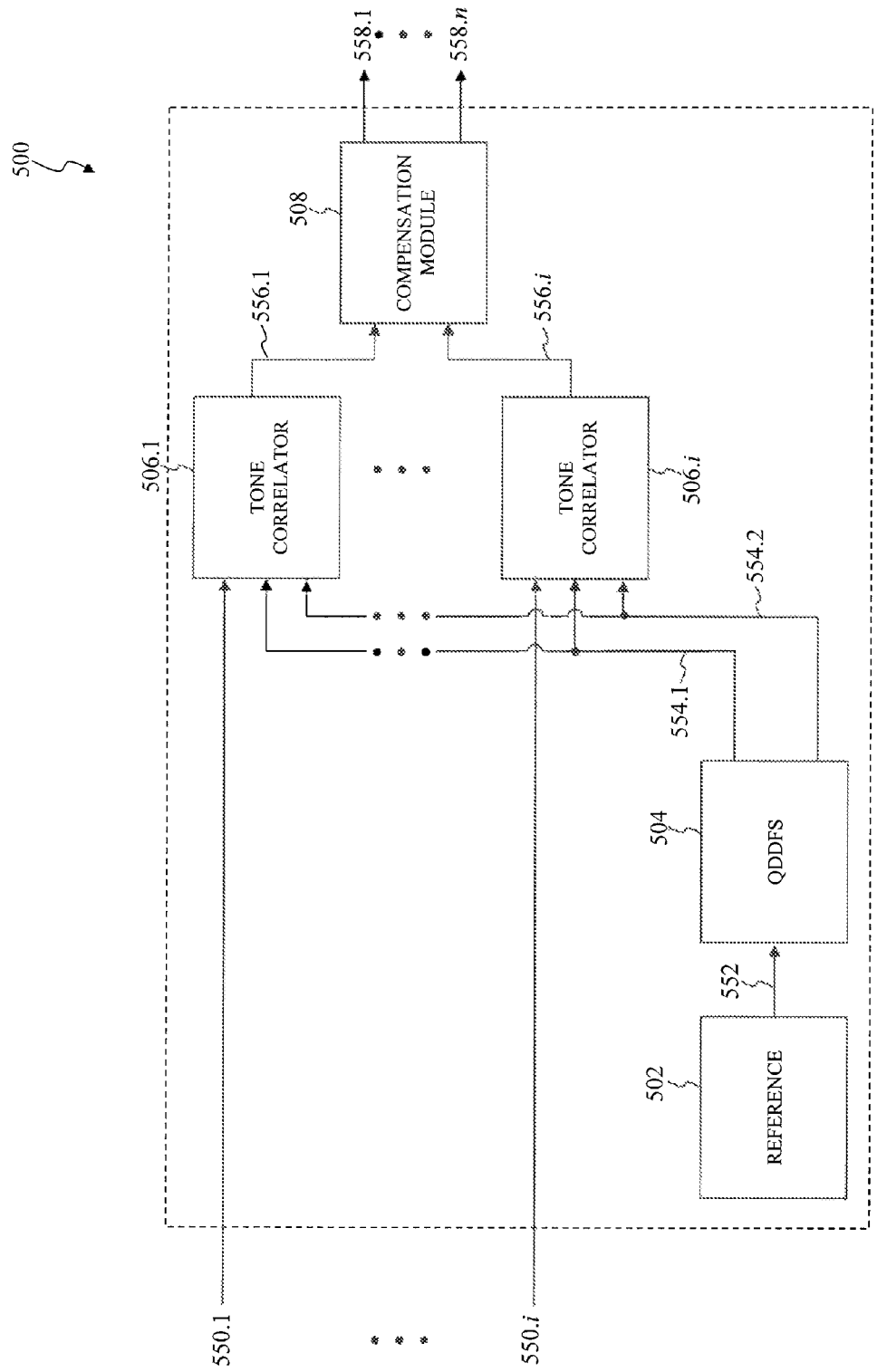
Figure 6:
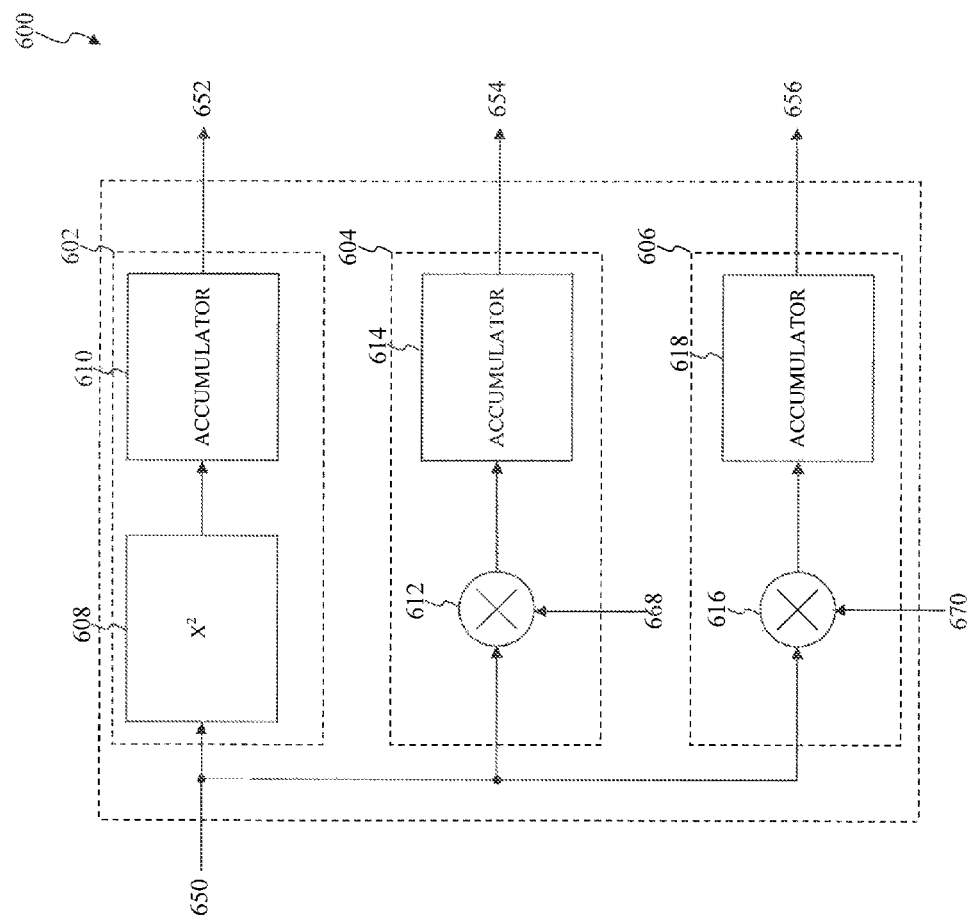
Figure 7:
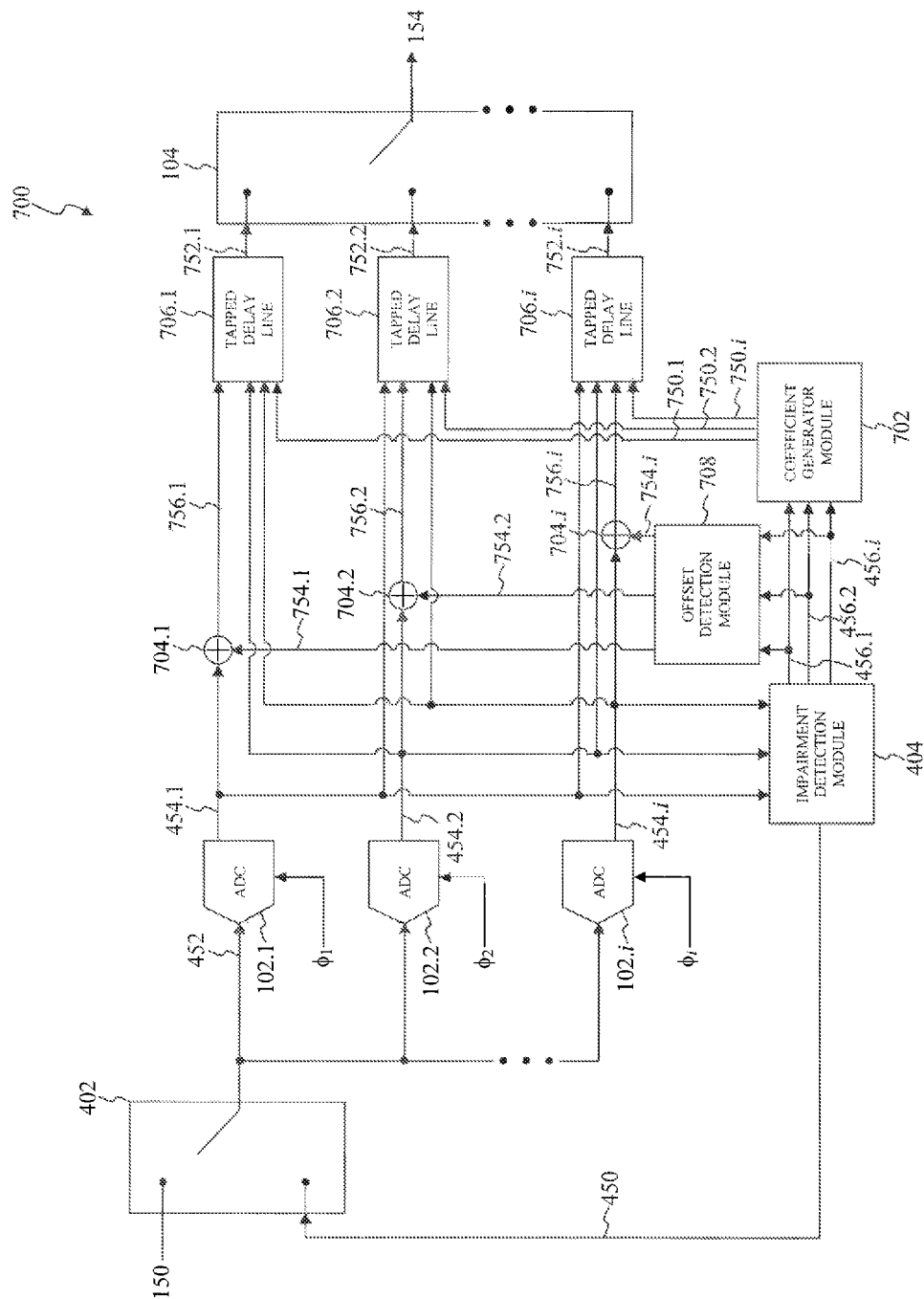

FIG. 3A graphically illustrates conventional multiple non-optimal phases of the sampling clock that may be used in the conventional multi-lane ADC;

FIG. 3B illustrates sampling of the analog input by the conventional multi-lane ADC using the conventional multiple non-optimal phases of the sampling clock;

FIG. 4 illustrates a block diagram of a multi-lane ADC according to an exemplary embodiment of the present disclosure;

FIG. 5 illustrates a block diagram of an exemplary impairment detection module that may be used in the multi-lane ADC according to an exemplary embodiment of the present disclosure;

FIG. 6 illustrates a block diagram of an exemplary tone correlator that may be used in the impairment detection module according to an exemplary embodiment of the present disclosure; and FIG. 7 illustrates a block diagram of a second multi-lane analog-to-digital converter (ADC) according to an exemplary embodiment of the present disclosure.

The disclosure will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE DISCLOSURE

The following Detailed Description refers to accompanying drawings to illustrate exemplary embodiments consistent with the disclosure. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the disclosure. Therefore, the Detailed Description is not meant to limit the disclosure. Rather, the scope of the i is defined only in accordance with the following claims and their equivalents.

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

The following Detailed Description of the exemplary embodiments will so fully reveal the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

For purposes of this discussion, the term "module" shall be understood to include at least one of software, firmware, and hardware (such as one or more circuits, microchips, or devices, or any combination thereof), and any combination thereof. In addition, it will be understood that each module may include one, or more than one, component within an actual device, and each component that forms a part of the described module may function either cooperatively or independently of any other component forming a part of the module. Conversely, multiple modules described herein may represent a single component within an actual device. Further, components within a module may be in a single device or distributed among multiple devices in a wired or wireless manner.

Conventional Multi-Lane Analog-to-Digital Converter (ADC)

Figure 1:
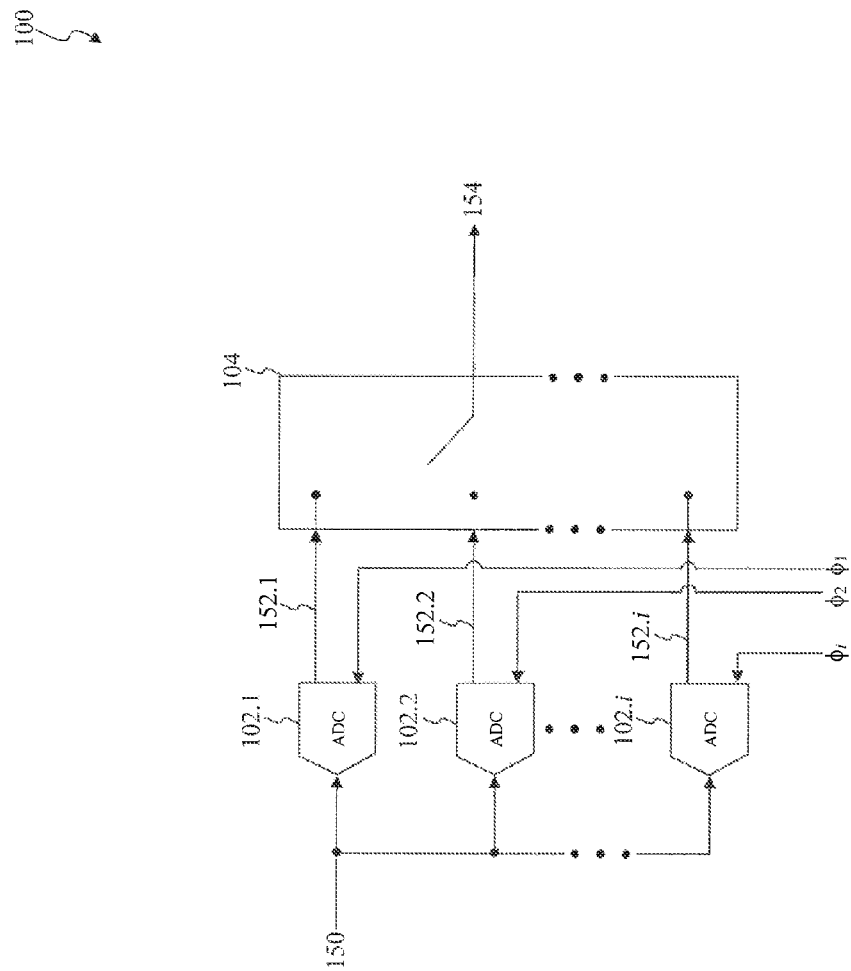
FIG. 1 illustrates a block diagram of a conventional multi-lane analog-to-digital converter (ADC)

FIG. 1 illustrates a block diagram of a conventional multi-lane analog-to-digital converter (ADC). A conventional multi-lane ADC 100 converts an analog input 150 from a first signal domain, such as an analog signal domain to provide an example, to a second signal domain, such as a digital signal domain to provide an example. The conventional multi-lane ADC 100 utilizes multiple phases of a sampling clock to sample the analog input 150 at different instances in time, converts these samples from the analog signal domain to the digital signal domain, and recombines these digital samples to produce digital output samples 154. The conventional multi-lane ADC 100 includes ADCs 102.1 through 102.$i$ and a switching module 104.

The switching module 104 combines or interleaves digital output segments 152.1 through 152.$i$ to produce the digital output samples 154. The switching module 104 provides the digital output segment 152.1 as a first sample of the digital output samples 154 after its conversion from the analog input segment 152.1 from the analog signal domain to the digital signal domain by the ADC 102.1. Thereafter, the switching module 104 provides the digital output segment 152.2 as a second sample of the digital output samples 154 after its conversion from the analog input segment 152.2 from the analog signal domain to the digital signal domain by the ADC 102.2. Afterwards, the switching module 104 provides the digital output segment 152.$i$ as an $i^{th}$ sample of the digital output samples 154 after its conversion from the analog input segment 152.$i$ from the analog signal domain to the digital signal domain by the ADC 102.$i$.

Generally, the ADCs 102.1 through 102.$i$ convert the analog input 150 from the analog signal domain to the digital signal domain in response to multiple phases $\phi_1$ through $\phi_i$ of a sampling clock to provide the digital output segments 152.1 through 152.$i$. Specifically, the ADCs 102.1 through 102.$i$ sample the analog input 150 at various optimal sampling points using the multiple phases $\phi_1$ through $\phi_i$ of the sampling clock. For example, the ADCs 102.1 through 102.$i$ sample the analog input 150 when their corresponding multiple phases $\phi_1$ through $\phi_i$ of the sampling clock is characterized as being at a logical one. Typically, the ADCs 102.1 through 102.$i$ collectively sample the analog input 150, staggered in time, each at a slower rate than the Nyquist frequency of the analog input 150, but collectively at a rate equal or surpassing the Nyquist frequency. The ADCs 102.1 through 102.$i$ convert this sampled representation of the analog input 150 from the analog signal domain to the digital signal domain to provide the digital output segments 152.1 through 152.$i$.

Optimal Phases of a Sampling Clock

Figure 2A:
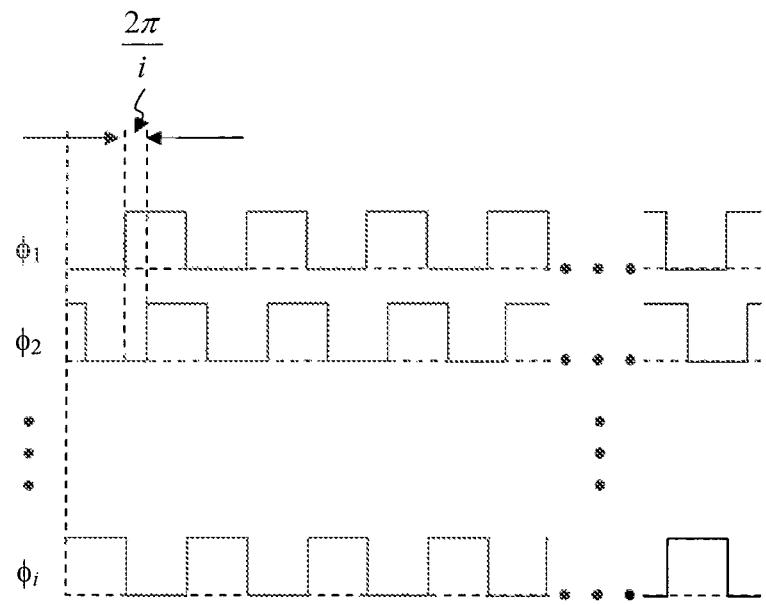
FIG. 2A illustrates conventional multiple optimal phases of a sampling clock that may be used in the conventional multi-lane ADC.

FIG. 2A illustrates conventional multiple optimal phases of a sampling clock that may be used in the conventional multi-lane ADC. Ideally, as shown in FIG. 2A, the multiple phases $\phi_1$ through $\phi_i$ of the sampling clock are characterized as having a similar frequency, but are offset in phase from each other. For example, the frequency of each of the multiple phases $\phi_1$ through $\phi_i$ of the sampling clock is given by:

$$\frac{f_{NYQ}}{i}, \qquad (1)$$

where $f_{NYQ}$ represents a Nyquist frequency of the analog input 150 and i represents a number of lanes of the conventional multi-lane ADC, namely a number of the ADCs 102.1 through 102.$i$. The phase offset between adjacent phases from among the multiple phases $\phi_1$ through $\phi_i$ of the sampling clock is characterized as being:

$$\frac{2\pi}{i}, \qquad (2)$$

where i represents the number of lanes of the conventional multi-lane ADC.

Figure 2B:
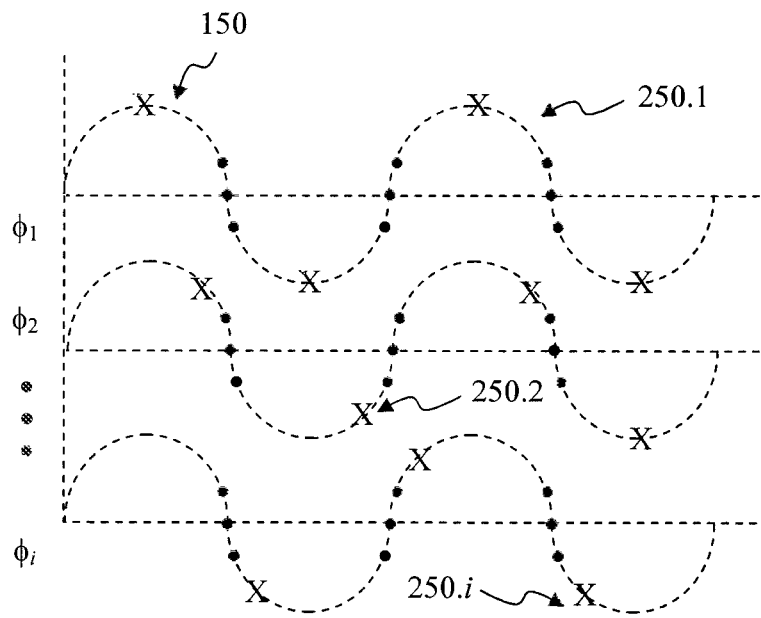
FIG. 2B illustrates sampling of an analog input by the conventional multi-lane ADC using the conventional multiple optimal phases of the sampling clock.

FIG. 2B illustrates sampling of an analog input by the conventional multi-lane ADC using the conventional multiple optimal phases of the sampling clock. Multiple ADCs, such as the ADCs 102.1 through 102.$i$ to provide an example, of a conventional multi-lane ADC, such as the conventional multi-lane ADC 100 to provide an example, collectively sample and convert an analog input, such as the analog input 150 to provide an example, using the multiple phases $\phi_1$ through $\phi_i$ of the sampling clock, which are then combined or interleaved to produce digital output samples, such as the digital output samples 154.

As shown in FIG. 2B, a first ADC from among the multiple ADCs samples the analog input 150 at its optimal sampling points X using the phase $\phi_1$ of the sampling clock to provide the optimal sampled analog input 250.1. A second ADC from among the multiple ADCs samples the analog input 150 at its optimal sampling points X using the phase $\phi_2$ of the sampling clock to provide the optimal sampled analog input 250.2. An $i^{th}$ ADC from among the multiple ADCs samples the analog input 150 at its optimal sampling points X using the phase $\phi_i$ of the sampling clock to provide the optimal sampled analog input 250.$i$. The multiple ADCs then convert their optimal sampling points X from the analog signal domain to the digital signal domain to provide digital output segments, such as the digital output segments 152.1 through 152.$i$ to provide an example, which when combined or interleaved produce the digital output samples 154 that most accurately represent the analog input 150.

Non-Optimal Phases of the Sampling Clock

However, impairments within the conventional multi-lane ADC 100 may cause impairments, such as amplitude offsets, direct current (DC) offsets, and/or phase offsets to provide some examples, within various signals of the conventional multi-lane ADC 100 that can cause the digital output samples 154 to no longer accurately represent the analog input 150. The impairments may result from unknown offsets between the multiple phases $\phi_1$ through $\phi_i$ of the sampling clock, linear imperfections within various lanes from among the multi-lanes of the conventional multi-lane ADC 100, DC offsets between the various lanes, amplitude offsets between the various lanes, and/or any other suitable impairment that will be apparent to those skilled in the relevant art(s) without departing from the spirit and scope of the present disclosure.

FIG. 3A graphically illustrates conventional multiple non-optimal phases of the sampling clock that may be used in the conventional multi-lane ADC. As discussed in FIG. 2A, optimally, the multiple phases $\phi_1$ through $\phi_i$ of the sampling clock are characterized as being offset from each other by similar amounts. However, in practice, impairments within the conventional multi lane ADC 100 can cause the multiple phases $\phi_1$ through $\phi_i$ of the sampling clock to be characterized as being are offset in phase by dissimilar amounts from each other. The phase offset between adjacent phases from among the multiple phases $\phi_1$ through $\phi_i$ of the sampling clock is characterized as being:

$$\frac{2\pi}{i} + \delta_i, \quad (3)$$

where i represents the number of lanes of the conventional multi-lane ADC and $\delta_i$ represents an unknown offset present in the phase $\phi_i$ of the sampling clock. Typically, each of the multiple phases $\phi_1$ through $\phi_i$ of the sampling clock is characterized as having a corresponding unknown offset $\delta_1$ through $\delta_i$. The unknown offsets $\delta_1$ through $\delta_i$ may cause their corresponding multiple phase $\phi_1$ through $\phi_i$ of the sampling clock to deviate from their corresponding optimal phase $\phi_1$ through $\phi_i$ of the sampling cloCk. For example, the unknown offsets $\delta_1$ through $\delta_i$ may cause their corresponding multiple phase $\phi_1$ through $\phi_i$ of the sampling clock to be slower or faster than their corresponding optimal phase $\phi_1$ through $\phi_i$ of the sampling clock. As a result, the ADCs 102.1 through 102.$i$ use these faster and/or slower multiple phases $\phi_1$ through $\phi_i$ of the sampling clock to sample the analog input segments 152.1 through 152.$i$ at non-optimal sampling points.

FIG. 3B illustrates sampling of the analog input by the conventional multi-lane ADC using the conventional multiple non-optimal phases of the sampling clock. Multiple ADCs, such as the ADCs 102.1 through 102.$i$ to provide an example, of a conventional multi-lane ADC, such as the conventional multi-lane ADC 100 to provide an example, collectively sample and convert an analog input, such as the analog input 150 to provide an example, using the multiple phases $\phi_1$ through $\phi_i$ of the sampling clock, which are then combined or interleaved to produce digital output samples, such as the digital output samples 154.

As shown in FIG. 3B, various impairments within the conventional multi-lane ADC can cause a first ADC from among the multiple ADCs to sample the analog input 150 at its non-optimal sampling points O when using the phase $\phi_1$ of the sampling clock to provide the non-optimal sampled analog input 350.1 and an $i^{th}$ ADC from among the multiple ADCs to sample the analog input 150 at its non-optimal sampling points O using the phase $\phi_i$ of the sampling clock to provide the non-optimal sampled analog input 350.$i$. The non-optimal sampling points O of the non-optimal sampled analog, inputs 350.1 through 350.$i$ lead or lag their respective optimal sampling points X of the optimal sampled analog inputs 250.1 through 250.$i$ by the unknown offsets $\delta_1$ through $\delta_i$. For example, the non-optimal sampling points O of the non-optimal sampled analog input 350.1 lag, namely occur at a later instance in time than, their respective optimal sampling points X of the optimal sampled analog input 250.1 by the unknown offset $\delta_1$. As another example, the non-optimal sampling points O of the optimal sampled analog input 250.$i$ lead, namely occur at an early instance in time than, their respective optimal sampling points X of the optimal sampled analog input 250.$i$ by the unknown offset $\delta_i$. The leading and/or lagging of the non-optimal sampling points O and the optimal sampling points X may cause the non-optimal sampling points O to no longer accurately represent the analog input 150 when combined or interleaved.

Additionally, other impairments within the conventional multi-lane ADC may cause the non-optimal sampling points O to no longer accurately represent the analog input 150 when combined or interleaved. These other impairments within the multiple ADCs may cause amplitude offset and/or DC offsets within various signals within the conventional multi-lane ADC. For example, as shown in FIG. 3B, impairments within the first through the $i^{th}$ ADC may cause the amplitude of the analog input 150 to deviate by unknown gains $\Delta G_1$ through $\Delta G_i$. Additionally, these impairments within the multiple ADCs may cause unwanted DC offsets to become present within the analog input 150. The unknown gains $\Delta G_1$ through $\Delta G_i$ and/or the unwanted DC offsets may cause the non-optimal sampling points O to no longer accurately represent the analog input 150 when combined or interleaved.

Multi-Lane Analog-to-Digital Converter (ADC)

Various multi-lane ADCs of the present disclosure substantially compensate for impairments, such as phase offset, amplitude offset, and/or DC offset to provide some examples, present within various signals that result from various impairments such that their respective digital output samples accurately represent their respective analog inputs. Generally, the various multi-lane ADCs of the present disclosure determine various statistical relationships, such as various correlations to provide an example, between these various signals and various known calibration signals to essentially quantify the phase offset, amplitude offset, and/or DC offset that may be present within the various signals. The various multi-lane ADCs adjust the various signals to substantially compensate for these offsets based upon these various statistical relationships such that their respective digital output samples accurately represent their respective analog inputs.

Analog Compensation of Impairments within the Multi-Lane ADC

FIG. 4 illustrates a block diagram of a multi-lane ADC according to an exemplary embodiment of the present disclosure. A multi-lane ADC 400 converts the analog input 150 from the analog signal domain to the digital signal domain in a normal mode of operation. In the normal mode of operation, the multi-lane ADC 400 utilizes multiple phases of a sampling clock to sample the analog input 150 at different instances in time, converts these samples from the analog signal domain to the digital signal domain, and recombines these digital samples to produce the digital output samples 154.

Alternatively, in a calibration mode of operation, the multi-lane ADC 400 determines various statistical relationships, such as various correlations to provide an example, between these digital samples and various known calibration signals to essentially quantify the impairments that may be present within the digital samples. The multi-lane ADC 400 determines various phase offset, amplitude offset, and/or DC offset signals based upon these various statistical relationships. The multi-lane ADC 400 uses these various phase offset, amplitude offset, and/or DC offset signals to compensate for the amplitude offsets, DC offsets, and/or phase offsets present within various signals of the multi-lane ADC 400 in the analog domain. The multi-lane ADC 400 includes the ADCs 102.1 through 102.i, the switching module 104, a second switching module 402, an impairment detection module 404, phase adjustment modules 406.1 through 406.i, and gain/offset adjustment modules 408.1 through 408.i.

The second switching module 402 selects between the analog input 150 in the normal mode of operation and a calibration signal 450 in the calibration mode of operation to provide an analog input 452. The calibration signal 450 represents a reference signal, such as a sinusoidal signal, that can be used to detect various amplitude offsets, DC offsets, and/or phase offsets present within various signals of the multi-lane ADC 400 that result from various impairments within the multi-lane ADC 400. Typically, the calibration signal 450 is characterized as having a known amplitude, a known DC offset, and/or a known phase that may be used to compare with the various signals to quantify the amplitude offsets, DC offsets, and/or phase offsets present within these various signals. In some situations, the calibration signal 450 may be characterized as having a single frequency, or single range of frequencies to quantify the amplitude offsets, DC offsets, and/or phase offsets present within the single frequency, or the single range of frequencies. In other situations, the calibration signal 450 may be characterized as having multiple frequencies, or multiple ranges of frequencies to quantify the amplitude offsets, DC offsets, and/or phase offsets present within the multiple frequencies, or the multiple ranges of frequencies.

The ADCs 102.1 through 102.i convert the analog input 452 from the analog signal domain to the digital signal domain in response to multiple time-aligned phases $\hat{\phi}_1$ through $\hat{\phi}_i$ of the sampling clock to provide digital output segments 454.1 through 454.i. Specifically, the ADCs 102.1 through 102.i sample the analog input 452 at various optimal sampling points using the multiple time-aligned phases $\hat{\phi}_1$ through $\hat{\phi}_i$ of the sampling clock. The ADCs 102.1 through 102.i convert this sampled representation of the analog input 452 from the analog signal domain to the digital signal domain to provide the digital output segments 454.1 through 454.i.

The impairment detection module 404 quantifies the amplitude offsets, DC offsets, and/or phase offsets present within various signals of the multi-lane ADC 400 that result from various impairments within the multi-lane ADC 400. Generally, the impairment detection module 404 determines a statistical relationship, such as correlation to provide an example, between the calibration signal 450 and various signals within the multi-lane ADC 400. For example, the impairment detection module 404 determines a correlation between the calibration signal 450 and the digital output segments 454.1 through 454.i to quantify the unknown offsets $\delta_1$ through $\delta_i$, the unknown gains $\Delta G_1$ through $\Delta G_i$, as described in FIG. 3B, and/or unknown DC offsets present within the digital output segments 454.1 through 454.i. Additionally, in this example, the impairment detection module 404 can assign one of the digital output segments 454.1 through 454.i as a reference lane and compare the correlations of other digital output segments 454.1 through 454.i to the correlation of the reference lane to quantify the unknown offsets $\delta_1$ through $\delta_i$, the unknown gains $\Delta G_1$ through $\Delta G_i$, as described in FIG. 3B, and/or unknown DC offsets present within the other digital output segments 454.1 through 454.i relative to the reference lane. The impairment detection module 404 provides impairment correction signals 456.1 through 456.i to various modules within the multi-lane ADC 400 to compensate for the amplitude offsets, DC offsets, and/or phase offsets present within these various signals.

Exemplary Phase Offset Estimation

A single tone signal, such as the calibration signal 450 to provide an example, at carrier frequency $f_c$ with analog distortions can be written as:

$$r(t) = (1+\beta)A\cos(2\pi f_c(t+\tau)) + d, \quad (4)$$

where $\tau$ denotes a phase or timing offset, $\beta$ denotes an amplitude offset, and d denotes a DC offset. When r(t) is correlated with the single tone signal having a random initial phase, the mean of the resulting signal is proportional to the timing offset $\tau$ as shown below:

$$E\{s(t)\} = E\{r(t) * \sin(2\pi f_c t + \theta)\} = -\frac{1}{2}a\sin(2\pi f_c \tau - \theta) \quad (5)$$

$$E\{c(t)\} = E\{r(t) * \cos(2\pi f_c t + \theta)\} = \frac{1}{2}a\cos(2\pi f_c \tau - \theta) \quad (6)$$

It is straight forward to compute:

$$\sin(2\pi f_c \tau - \theta) = -\frac{E\{s(t)\}}{\sqrt{E^2\{c(t)\} + E^2\{s(t)\}}} \quad (7)$$

$$\cos(2\pi f_c \tau - \theta) = \frac{E\{c(t)\}}{\sqrt{E^2\{c(t)\} + E^2\{s(t)\}}} \quad (8)$$

In practice, the single tone signal is applied to the multi-lane ADC 400 in the calibration mode of operation. Various outputs of the various lanes of the multi-lane ADC 400, namely the digital output segments 454.1 through 454.i, are serially measured by the impairment detection module 404. As a result, the random initial phase of the signal tone signal is typically common across all the various lanes and can be cancelled by identifying one of the lanes as the reference lane and referencing the random initial phase present on the other lanes to the reference lane. Additionally, the single tone can be swept over a set of frequencies $\{f_c(k)\}$ to derive a least square timing offset by measuring:

$$\sin(2\pi f_c(k)\tau(j) - \theta(k)), \cos(2\pi f_c(k)\tau(j) - \theta(k)) \quad (9)$$

By defining $r_j(f_c(k), t)$ as an output of the $j^{th}$ lane from among the various lanes of the multi-lane ADC 400 having a tone of frequency $\{f_c(k)\}$, $E_S(f_c(k), \tau(j))$ and $E_C(f_c(k), \tau(j))$ as an output of the impairment detection module 404 that corresponds to the $j^{th}$ lane, and θ(k) as the random initial phase offset between the input sequence, namely, the analog input 452 to provide an example, and the single tone signal, then:

$$s(f_c(k), j, t) = r_j(f_c(k), t) * \sin(2\pi f_c(k)t + \theta_k) \quad (10)$$

$$c(f_c(k), j, t) = r_j(f_c(k), t) * \cos(2\pi f_c(k)t + \theta_k) \quad (11)$$

$$E_S(f_c(k), \tau(j)) = E\{s(f_c(k), j, t\} = -\frac{1}{2}a_j\sin(2\pi f_c(k)t + \theta_k) \quad (12)$$

$$E_C(f_c(k), \tau(j)) = E\{c(f_c(k), j, t\} = \frac{1}{2}a_j\cos(2\pi f_c(k)t + \theta_k) \quad (13)$$

$$Q(f_c(k), \tau(j)) = \frac{-E_S(f_c(k), \tau(j))}{\sqrt{E_S^2(f_c(k), \tau(j)) + E_C^2(f_c(k), \tau(j))}} \quad (14)$$

$$= \sin(\varphi(k, j)) = \sin(2\pi f_c(k)\tau(j) - \theta(k)) \quad (15)$$

$$I(f_c(k), \tau(j)) = \frac{E_C(f_c(k), \tau(j))}{\sqrt{E_S^2(f_c(k), \tau(j)) + E_C^2(f_c(k), \tau(j))}} \quad (16)$$

$$= \cos(\varphi(k, j)) = \cos(2\pi f_c(k)\tau(j) - \theta(k)) \quad (17)$$

The quantity φ(k, j) can be obtained by evaluating $\sin^{-1}(Q(f_c(k),\tau(j)))$. However, this operation limits the quantity φ(k, j) to $$\left[\frac{-\pi}{2}, \frac{\pi}{2}\right]$$

by wrapping around $$n\pi + \frac{\pi}{2},$$

and it can cause phase discontinuity across different lane observations. Therefore, the phase should be unwrapped across all the lane observations so that the linear relationship φ(k,j)=2π$f_c$(k)τ(j)–θ(k) is pertained. For example, an angle in the second quadrant π–θ will be wrapped into θ and an angle in the third quadrant π+θ will be wrapped into –θ. Both the real part I($f_c$(k),τ(j)) and the imaginary part Q($f_c$(k),τ(j)) are leveraged to unwrap the phase.

By defining φ(k, j)=$\sin^{-1}$(Q($f_c$(k),τ(j))) a phase unwrapping procedure can be described as:

```
if {I(fc(k),τ(j))}j for a given frequency fc(k) are of different signs then
    if I(fc(k),τ(j)) < 0 and Q(fc(k),τ(j)) > 0 then
        φuw (k, j) = π – φ(k, j)
    end if
    if I(fc(k),τ(j)) < 0 and Q(fc(k),τ(j)) < 0 then
        φuw (k, j) = –π – φ(k, j)
    end if
else
    if I(fc(k),τ(j)) < 0 then
        φuw (k, j) = π – φ(k, j)
    endif
endif
```

After phase unwrapping, the common phase θ(k) can be removed by subtracting the reference lane and estimating the timing offset τ by least square estimation as given by:

$$\phi(k, j) = \varphi_{uw}(k, j) - \varphi_{uw}(k, 0) \quad (18)$$

$$\tau(j) = \frac{N_{fc}\sum_k 2\pi f_c(k)\phi(k, j) - 2\pi f_c(k)\sum_k \phi(k, j)}{N_{fc}\sum_k (2\pi f_c(k))^2 - (\sum_k 2\pi f_c(k))^2}, \quad (19)$$

where $N_{fc}$ denotes a number of tone measurements. In practical design, the averaging process can be implemented by a linear filter defined as:

$$H(z) = \frac{(\xi - \alpha)Z^{-1}}{1 - (1-\alpha)Z^{-1}} \quad (20)$$

In some circumstances, the frequency response of this filter is not of unit gain at approximately DC; therefore, the filter output can be scaled by $$\frac{\alpha}{\xi - \alpha}t6$$

normalize to unit gain. Additionally, when ξ=2α, this filter approximates a standard leaky average filter.

Exemplary Gain Offset Estimation

The gain offset estimates can be obtained by measuring a mean energy of one of the lanes and comparing it with the reference lane as shown below:

$$G(f_c(k), j) = E\{s^2(fc(k), j, t) + c^2(fc(k), j, t)\} \quad (21)$$

$$\widehat{B}_j = \frac{1}{N_{fc}}\sum_k \sqrt{\frac{G(f_c(k), j)}{G(f_c(k), 0)}} - 1 \quad (22)$$

Alternatively, the gain offset estimates can be estimated by measuring an amplitude of a correlator output of one of the tone correlators 506.1 through 506.i and comparing it with the reference lane, where:

$$G(f_c(k), j) = E_S^2(f_c(k), \tau(j)) + E_C^2(f_c(k), \tau(j)) = \frac{1}{4}a_j^2 \quad (23)$$

Exemplary DC Offset Estimation

The DC offset for the various lanes can be measured using the digital sequences 550.1 through 550.i. Assuming the DC offset is constant for each of the various lanes, the DC offset can averaged across multiple tone measurements as denoted by:

$$\hat{a}_j = \frac{1}{N_{fc}}\sum_k E\{r_j(f_c(k), t)\} \quad (24)$$

Additionally, the impairment detection module 404 may provide the calibration signal 450 that is used to quantify the amplitude offset, phase offset, and/or DC offset present within various signals of the multi-lane ADC 400. Alternatively, those skilled in the relevant art(s) will recognize that the calibration signal 450 may be provided to the second switching module 402 and the impairment detection module 404 by another electrical, mechanical, and/or electro-mechanical device without departing from the spirit and scope of the present disclosure.

The phase adjustment modules 406.1 through 406.$i$ adjust the multiple phases $\phi_1$ through $\phi_i$ of the sampling clock in response to the impairment correction signals 456.1 through 456.$i$ to provide the multiple time-aligned phases $\hat{\phi}_1$ through $\hat{\phi}_i$ of the sampling clock. Typically, the phase adjustment modules 406.1 through 406.$i$ adjust the multiple phases $\phi_1$ through $\phi_i$ of the sampling clock to substantially compensate for the unknown offsets $\delta_1$ through $\delta_i$ that can be present within the multiple phases $\phi_1$ through $\phi_1$ of the sampling clock. The phase adjustment modules 406.1 through 406.$i$ can advance and/or retreat phases of the multiple phases $\phi_1$ through $\phi_i$ of the sampling clock to substantially compensate for the unknown offsets $\delta_1$ through $\delta_i$.

The gain/offset adjustment modules 408.1 through 408.$i$ adjust the digital output segments 454.1 through 454.$i$ in response to the impairment correction signals 456.1 through 456.$i$ to provide compensated digital output segments 458.1 through 458.$i$. Typically, the gain/offset adjustment modules 408.1 through 408.$i$ adjust the digital output segments 454.1 through 454.$i$ to substantially compensate for the unknown gains $\Delta G_1$ through $\Delta G_i$ and/or the unknown offsets that can be present within the digital output segments 454.1 through 454.$i$. The gain/offset adjustment modules 408.1 through 408.$i$ can adjust increase and/or decrease amplitudes of and/or offsets with the digital output segments 454.1 through 454.$i$ to substantially compensate for the unknown gains $\Delta G_1$ through $\Delta G_i$ and/or the unknown offsets.

The switching module 104 combines or interleaves the compensated digital output segments 458.1 through 458.$i$ to produce the digital output samples 154.

Exemplary Impairment Detection Module

FIG. 5 illustrates a block diagram of an exemplary impairment detection module that may be used in the multi-lane ADC according to an exemplary embodiment of the present disclosure. A impairment detection module 500 determines a correlation between a known calibration signal, such as the calibration signal 450 to provide an example, and various signals within a multi-lane ADC, such as the multi-lane ADC 400 to provide an example, to quantify the unknown offsets $\delta_1$ through $\delta_i$, the unknown gains $\Delta G_1$ through $\Delta G_i$, as described in FIG. 3B, and/or DC unknown offsets present within these various signals. The impairment detection module 500 provides phase, amplitude, and/or offset signals to various modules within the multi-lane ADC to compensate for the amplitude offset, phase offset, and/or DC offset that is present within these various signals. The impairment detection module 500 includes a reference module 502, a quadrature direct digital frequency synthesizer (QDDFS) 504, tone correlators 506.1 through 506.$i$, and a compensation module 508. The impairment detection module 500 may represent an exemplary embodiment of the impairment detection module 404.

The reference module 502 generates a calibration signal 552 having a known amplitude, phase, and/or DC offset. Typically, the reference module 502 includes an electrical, mechanical, and/or electro-mechanical oscillator. For example, this oscillator may include harmonic, or linear, oscillator to produce a sinusoidal output and/or a relaxation oscillator to produce a non-sinusoidal output, such as a square, sawtooth, or triangular output. This oscillator may provide the calibration signal 552 and/or can be used a reference for a phase-locked loop (PLL) which, in turn, can provide the calibration signal 552. In some embodiments, the calibration signal 552 may be used by the multi-lane ADC 400 as the calibration signal 450 in the calibration mode of operation.

The QDDFS 504 provides a digital reference sequence 554, including an in-phase reference sequence 554.1 and a quadrature phase reference sequence 554.2, based upon the calibration signal 552. The quadrature phase reference sequence 554.2 is approximately 90 degrees out of phase from the in-phase reference sequence 554.1. The QDDFS 504 frequency translates and/or digitizes the calibration signal 552 to provide the in-phase reference sequence 554.1 and the quadrature phase reference sequence 554.2. Typically, the QDDFS 504 multiples a frequency of the calibration signal 552 by the number of lanes of the multi-lane ADC.

The tone correlators 506.1 through 506.$i$ determine a correlation between the digital reference sequence 554 and digital sequences 550.1 through 550.$i$, such as the digital output segments 454.1 through 454.$i$ to provide an example. Specifically, the tone correlators 506.1 through 506.$i$ can determine a first plurality of phase offsets $\phi_{i1}$ through $\phi_{ii}$ between the in-phase reference sequence 554.1 and the digital sequences 550.1 through 550.$i$. Additionally, the tone correlators 506.1 through 506.$i$ can determine a second plurality of phase offsets $\phi_{q1}$ through $\phi_{qi}$ between the quadrature phase reference sequence 554.2 and the digital sequences 550.1 through 550.$i$. Further, the tone correlators 506.1 through 506.$i$ can determine a plurality of amplitudes $\sigma_1^2$ through $\sigma_i^2$ of the digital sequences 550.1 through 550.$i$. Yet further, the tone correlators 506.1 through 506.$i$ can determine a plurality of DC offsets $\Delta_1$ through $\Delta_i$ of the digital sequences 550.1 through 550.$i$. The tone correlators 506.1 through 506.$i$ provide the first plurality of phase offsets $\phi_{i1}$ through $\phi_{ii}$, the second plurality of phase offsets $\phi_{q1}$ through $\phi_{qi}$, the plurality of amplitudes $\sigma_1^2$ through $\sigma_i^2$ and/or the plurality of DC offsets $\Delta_1$ through $\Delta_i$ as amplitude, phase, and/or DC offset correlations 556.1 through 556.$i$.

The compensation module 508 provides phase, amplitude, and/or DC offset signals 558.1 through 558.$i$, which can represent an exemplary embodiment of the impairment correction signals 456.1 through 456.$i$ to provide an example, in response to the amplitude, phase, and/or DC offset correlations 556.1 through 556.$i$. For example, the compensation module 508 assigns one of the lanes that corresponds to one of the amplitude, phase, and/or DC offset correlations 556.1 through 556.$i$ as a reference lane. The compensation module 508 compares other amplitude, phase, and/or DC offset correlations 556.1 through 556.$i$ corresponding to other lanes from to this reference lane to determine the amplitude, phase, and/or DC offsets between these other lanes and the reference lane. For example, the compensation module 508 can determine the unknown phase offset between one of these other lanes and the reference lane by evaluating:

$$\tan^{-1}\left(\frac{\phi_q}{\phi_i}\right), \quad (25)$$

where $\phi_i$ represents in-phase component of one of these other lanes and $\phi_q$ represents the quadrature phase offset of one of these other lanes, and comparing this to the phase of the reference lane. As another example, the compensation module 508 can determine the unknown amplitude offset between one of these other lanes and the reference lane by comparing a mean energy of one of these other lanes with a mean energy of the reference lane. The compensation module 508 provides the phase, amplitude, and/or DC offset signals 558.1 through 558.$i$ to compensate for the amplitude offset, phase offset, and/or DC offset within these other lanes relative to the reference lane.

The compensation module 508 can compare the amplitude, phase, and/or DC offset correlations 556.1 through 556.$i$ that corresponds to the reference lane with the amplitude, phase, and/or DC offset correlations 556.1 through 556.$i$ that correspond to other lanes to provide plurality of impairment errors that represent estimates of the amplitude offset, phase offset, and/or DC offset within these other lanes of the multi-lane ADC. The compensation module 508 can generate the phase, amplitude, and/or DC offset signals 558.1 through 558.$i$ which minimize these impairment errors. The compensation module 508 may generate the phase, amplitude, and/or DC offset signals 558.1 through 558.$i$ using the Least Mean Squared (LMS), Recursive Least Squares (RLS), Minimum Mean Squared Error (MMSE) algorithms or any suitable algorithm that yields a result which minimizes an error quantified by some metric, such as a minimum-mean-square error to provide an example, that will be apparent to those skilled in the relevant art(s) without departing from the spirit and scope of the present invention.

Exemplary Tone Correlator

FIG. 6 illustrates a block diagram of an exemplary tone correlator that may be used in the impairment detection module according to an exemplary embodiment of the present disclosure. A tone correlator 600 determines a correlation between a known calibration signal, such as the calibration signal 450 or the calibration signal 552 to provide some examples, and various signals within a multi-lane ADC, such as the multi-lane ADC 400 to provide an example, to quantify the unknown offsets $\delta_1$ through $\delta_i$, the unknown gains $\Delta G_1$ through $\Delta G_i$, as described in FIG. 3B, and/or DC unknown offsets present within these various signals. The tone correlator 600 determines a mean amplitude 652 of a digital sequence 650, such as one of the digital output segments 454.1 through 454.$i$ and/or one the digital sequences 550.1 through 550.$i$ to provide some examples. Additionally, the tone correlator 600 determines an in-phase offset 654 between an in-phase component 658 of the reference sequence, such as the in-phase reference sequence 554.1 to provide an example, and the digital sequence 650. Further, the tone correlator 600 determines a quadrature phase offset 656 between a quadrature phase component 660 of the reference sequence and the digital sequence 650. The tone correlator 600 includes an amplitude detection module 602, a first phase detection module 604, and a second phase detection module 606. The tone correlator 600 can represent an exemplary embodiment of one of the tone correlators 506.1 through 506.$i$.

The amplitude detection module 602 determines a mean energy of the digital sequence 650 to provide the mean amplitude 652. The amplitude detection module 602 includes a mathematical expectation module 608 and an accumulator 610. The mathematical expectation module 608 determines a weighted average of the digital sequence 650 which is then accumulated by the accumulator 610 to provide the mean amplitude 652.

The first phase detection module 604 determines the in-phase offset 654 between the in-phase component 658 and the digital sequence 650. The first phase detection module 604 includes a multiplication module 612 and an accumulator 614. The multiplication module 612 multiplies the digital sequence 650 and the in-phase component 658 which is then accumulated by the accumulator 614 to provide the in-phase offset 654.

The second phase detection module 606 determines the quadrature phase offset 656 between the quadrature phase component 660 and the digital sequence 650. The second phase detection module 606 includes a multiplication module 616 and an accumulator 618. The multiplication module 616 multiplies the digital sequence 650 and the quadrature phase component 660 which is then accumulated by the accumulator 618 to provide the quadrature phase offset 656.

Digital Compensation of Impairments within the Multi-Lane ADC

FIG. 7 illustrates a block diagram of a second multi-lane analog-to-digital converter (ADC) according to an exemplary embodiment of the present disclosure. A multi-lane ADC 700 converts the analog input 150 from the analog signal domain to the digital signal domain in a normal mode of operation. In the normal mode of operation, the multi-lane ADC 700 utilizes multiple phases of a sampling clock to sample the analog input 150 at different instances in time, converts these samples from the analog signal domain to the digital signal domain, and recombines these digital samples to produce the digital output samples 154.

Alternatively, in a calibration mode of operation, the multi-lane ADC 700 determines various statistical relationships, such as various correlations to provide an example, between these digital samples and various known calibration signals to essentially quantify the impairments that may be present within the digital samples. The multi-lane ADC 700 determines various phase offset, amplitude offset, and/or DC offset signals based upon these various statistical relationships. The multi-lane ADC 700 uses these various phase offset, amplitude offset, and/or DC offset signals to compensate for the amplitude offsets, DC offsets, and/or phase offsets present within various signals of the multi-lane ADC 700 in the digital domain. The multi-lane ADC 700 includes the ADCs 102.1 through 102.$i$, the switching module 104, the second switching module 402, the impairment detection module 404, a coefficient generator module 702, combination modules 704.1 through 704.$i$, tapped delay line modules 706.1 through 706.$i$, and an offset detection module 708.

The second switching module 402 selects between the analog input 170 in the normal mode of operation and the calibration signal 450 in the calibration mode of operation to provide the analog input 452.

The ADCs 102.1 through 102.$i$ convert the analog input 452 from the analog signal domain to the digital signal domain in response to the multiple phases $\phi_1$ through $\phi_i$ of the sampling clock to provide digital output segments 454.1 through 454.$i$. Specifically, the ADCs 102.1 through 102.$i$ sample the analog input 452 at various optimal sampling points using the multiple phases $\phi_1$ through $\phi_i$ of the sampling clock. The ADCs 102.1 through 102.$i$ convert this sampled representation of the analog input 452 from the analog signal domain to the digital signal domain to provide the digital output segments 454.1 through 454.$i$.

The impairment detection module 404 quantifies the amplitude offsets, DC offsets, and/or phase offsets present within various signals of the multi-lane ADC 700 that result from various impairments within the multi-lane ADC 700 to provide the impairment correction signals 456.1 through 456.$i$.

The offset detection module 708 provides DC offset signals 754.1 through 754.$i$ in response to the impairment correction signals 456.1 through 456.$i$. The offset detection module 708 provides the DC offset signals 754.1 through 754.$i$ which minimize DC offset between the digital output segments 454.1 through 454.$i$. Alternatively, the offset detection module 708 provides the DC offset signals 754.1 through 754.*i* such that any DC offsets are substantially equivalent for between the digital output segments 454.1 through 454.*i*.

The combination modules 704.1 through 704.*i* combine the digital output segments 454.1 through 454.*i* and the DC offset signals 754.1 through 754.*i* to provide offset corrected output segments 756.1 through 756.*i*.

The coefficient generator module 702 provides sets of correction coefficients 750.1 through 750.*i* to the tapped delay line modules 706.1 through 706.*i* in response to the impairment correction signals 456.1 through 456.*i*. The coefficient generator module 702 can generate the sets of correction coefficients 750.1 through 750.*i* which minimize amplitude offset, and/or phase offset between the calibration signal 450 and the offset corrected output segments 756.1 through 756.*i*. The coefficient generator module 702 may generate the sets of correction coefficients 750.1 through 750.*i* using the Least Mean Squared (LMS), Recursive Least Squares (RLS), Minimum Mean Squared Error (MMSE) algorithms or any suitable adaptive algorithm that yields a result which minimizes an error quantified by some metric, such as a minimum-mean-square error to provide an example, that will be apparent to those skilled in the relevant art(s) without departing from the spirit and scope of the present invention.

The tapped delay line modules 706.1 through 706.*i* compensate for the amplitude offset and/or phase offset within the offset corrected output segments 756.1 through 756.*i* to provide compensated digital output segments 752.1 through 752.*i*. The tapped delay line modules 706.1 through 706.*i* weight each of their corresponding taps according to the sets of correction coefficients 750.1 through 750.*i* to compensate for the amplitude offset and/or phase offset within the offset corrected output segments 756.1 through 756.*i*. In an exemplary embodiment, the tapped delay line modules 706.1 through 706.*i* can be implemented as part of one or more adaptive equalizers. The one or more adaptive equalizers adaptively adjust their impulse response according to the sets of correction coefficients 750.1 through 750.*i* to compensate for the amplitude offset and/or phase offset within the offset corrected output segments 756.1 through 756.*i*. These adaptive equalizers may be implemented using any suitable adaptive filters, such as, but not limited to, one or more decision feedback equalizers (DFEs), one or more feed forward equalizers (FFEs), and/or any combination thereof.

The switching module 104 combines or interleaves the compensated digital output segments 752.1 through 752.*i* to produce the digital output samples 154.

Conclusion

It is to be appreciated that the Detailed Description section, and not the Abstract section, is intended to be used to interpret the claims. The Abstract section may set forth one or more, but not all exemplary embodiments, of the disclosure, and thus, are not intended to limit the disclosure and the appended claims in any way.

The disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the disclosure. Thus the disclosure should not be limited by any of the above-described exemplary embodiments, but should be defined only in accordance with the following claims and their equivalents.

What is claimed is:

1. A multi-lane analog to digital converter (ADC) for converting an analog input from an analog signal domain to a digital signal domain to provide digital output samples, comprising:
    a plurality of ADCs configured to:
        convert the analog input from the analog signal domain to the digital signal domain to provide a first plurality of digital output segments in a first mode of operation, each of the plurality of ADCs being configured to sample the analog input using a corresponding phase from among multiple phases of a sampling clock, the multiple phases being offset from each other, and
        convert a calibration signal from the analog signal domain to the digital signal domain to provide a second plurality of digital output segments in a second mode of operation, each of the plurality of ADCs being configured to sample the calibration signal using the corresponding phase from among the multiple phases of the sampling clock;
    a switching module configured to interleave the first plurality of digital output segments to provide the digital output samples; and
    an impairment detection module configured to:
        generate the calibration signal having a known characteristic in the second mode of operation, and
        determine statistical relationships between the second plurality of digital output segments and the calibration signal to quantify impairments induced by the plurality of ADCs on the first plurality of digital output segments.

2. The multi-lane ADC of claim 1, wherein the statistical relationships are correlations between the second plurality of digital output segments and the calibration signal.

3. The multi-lane ADC of claim 1, wherein the impairments comprise:
    phase offsets between phases from among the multiple phases and the calibration signal;
    amplitude offsets between the second plurality of digital output segments and the calibration signal; or
    direct current (DC) offsets between the second plurality of digital output segments and the calibration signal.

4. The multi-lane ADC of claim 1, wherein the calibration signal is a sinusoidal signal having a known frequency.

5. The multi-lane ADC of claim 1, wherein the impairment detection module is further configured to provide a plurality of impairment correction signals based upon the statistical relationships, and further comprising:
    a phase adjustment module configured to adjust a phase of one of the multiple phases based upon a corresponding first one of the plurality of impairment correction signals; and
    a gain/offset adjustment module configured to adjust an amplitude and a direct current (DC) offset of one of the first plurality of digital output segments based upon a corresponding second one of the plurality of impairment correction signals.

6. The multi-lane ADC of claim 1, wherein the impairment detection module is further configured to provide a plurality of impairment correction signals based upon the statistical relationships, and further comprising:
    a coefficient generator module configured to provide a plurality of sets of correction coefficients based upon the plurality of impairment correction signals; and a plurality of tapped delay line modules, coupled to the plurality of ADCs, configured to compensate for the impairments within the first plurality of digital output segments by weighting their corresponding taps using corresponding sets of correction coefficients from among the plurality of sets of correction coefficients to provide a plurality of compensated digital output segments, wherein the switching module is further configured to interleave the plurality of compensated digital output segments to provide the digital output samples.

7. The multi-lane ADC of claim 6, wherein the coefficient generator module is further configured to update the plurality of sets of correction coefficients using an adaptive algorithm that yields a result which minimizes errors between the second plurality of digital output segments and the calibration signal.

8. The multi-lane ADC of claim 1, wherein the impairment detection module is further configured to assign one of the second plurality of digital output segments as a reference lane and to compare the statistical relationships of the other digital output segments from among the second plurality of digital output segments to a statistical relationship of the reference lane to quantify the impairments of the other digital output segments relative to the reference lane.

9. The multi-lane ADC of claim 8, wherein the statistical relationships are correlations between the second plurality of digital output segments and the calibration signal.

10. A multi-lane analog to digital converter (ADC) for converting an analog input from an analog signal domain to a digital signal domain to provide digital output samples, comprising:

a plurality of ADCs configured to:
convert the analog input from the analog signal domain to the digital signal domain to provide a first plurality of digital output segments in a first mode of operation, each of the plurality of ADCs being configured to sample the analog input using a corresponding phase from among multiple phases of a sampling clock, the multiple phases being offset from each other, and
convert a calibration signal from the analog signal domain to the digital signal domain to provide a second plurality of digital output segments in a second mode of operation, each of the plurality of ADCs being configured to sample the calibration signal using the corresponding phase from among the multiple phases of the sampling clock;

an impairment detection module configured to:
generate the calibration signal having a known amplitude, a known direct current (DC) offset, or a known phase, and
determine statistical relationships between the second plurality of digital output segments and a plurality of frequencies of the calibration signal to quantify impairments induced by the plurality of ADCs on the first plurality of digital output segments;

a coefficient generator module configured to provide a plurality of sets of correction coefficients based upon the statistical relationships;

a plurality of tapped delay line modules, coupled to the plurality of ADCs, configured to compensate for the impairments by weighting their corresponding taps using corresponding sets of correction coefficients from among the plurality of sets of correction coefficients to provide a plurality of compensated digital output segments; and a switching module configured to interleave the plurality of compensated digital output segments to provide the digital output samples.

11. The multi-lane ADC of claim 10, wherein the statistical relationships are correlations between the second plurality of digital output segments and the calibration signal.

12. The multi-lane ADC of claim 10, wherein the impairment detection module is further configured to determine the statistical relationships between the second plurality of digital output segments and the calibration signal to quantify the impairments within the first plurality of digital output segments.

13. The multi-lane ADC of claim 12, wherein the impairment detection module is further configured to:
assign one of the second plurality of digital output segments as a reference lane, and
compare the statistical relationships for the other digital output segments from among the second plurality of digital output segments to a statistical relationship of the reference lane to quantify the impairments of the other digital output segments relative to the reference lane.

14. The multi-lane ADC of claim 13, wherein the statistical relationships are correlations between the second plurality of digital output segments and the calibration signal.

15. The multi-lane ADC of claim 10, wherein the impairments comprise:
phase offsets between phases from among the multiple phases and the calibration signal; or
amplitude offsets between the second plurality of digital output segments and the calibration signal.

16. The multi-lane ADC of claim 10, further comprising:
an offset detection module configured to determine a DC offset between the second plurality of digital output segments and the calibration signal to provide a plurality of DC offset signals; and
a plurality of combination modules configured to combine the second plurality of digital output segments with the plurality of DC offset signals to provide a plurality of offset corrected output segments,
wherein the plurality of tapped delay line modules are further configured to compensate for impairments within the plurality of offset corrected output segments.

17. The multi-lane ADC of claim 10, wherein the plurality of tapped delay line modules are implemented as part of a plurality of adaptive equalizers, the plurality of adaptive equalizers being configured to compensate for the impairments within the second plurality of digital output segments by adjusting their impulse responses using the plurality of sets of correction coefficients.

18. A multi-lane analog to digital converter (ADC) configured for converting an analog input from an analog signal domain to a digital signal domain to provide digital output samples, comprising:

a plurality of ADCs configured to:
convert the analog input from the analog signal domain to the digital signal domain to provide a first plurality of digital output segments in a first mode of operation, each of the plurality of ADCs being configured to sample the analog input using a corresponding phase from among multiple phases of a sampling clock, the multiple phases being offset from each other, and
convert a calibration signal from the analog signal domain to the digital signal domain to provide a second plurality of digital output segments in a second mode of operation, each of the plurality of ADCs being configured to sample the calibration signal using the corresponding phase from among, the multiple phases of the sampling clock;
an impairment detection module configured to:
generate the calibration signal having a known amplitude, a known direct current (DC) offset, or a known phase, and
determine statistical relationships between the second plurality of digital output segments and the calibration signal to quantify impairments induced by the plurality of ADCs on the first plurality of digital output segments;
a plurality of phase adjustment modules configured to adjust phases of the multiple phases based upon the statistical relationships to compensate for the impairments;
a plurality of gain/offset adjustment modules, coupled to the plurality of ADCs, configured to adjust amplitudes and direct current (DC) offsets of the first plurality of digital output segments based upon the statistical relationships to provide a plurality of compensated digital output segments; and
a switching module configured to interleave the plurality of compensated digital output segments to provide the digital output samples.

19. The multi-lane ADC of claim 18, wherein the statistical relationships are correlations between the second plurality of digital output segments and the calibration signal.

20. The multi-lane ADC of claim 18, wherein the impairment detection module is further configured to assign one of the second plurality of digital output segments as a reference lane and to compare the statistical relationships of the other digital output segments from among the second plurality of digital output segments to a statistical relationship of the reference lane to quantify the impairments of the other digital output segments relative to the reference lane.

21. The multi-lane ADC of claim 18, wherein the impairments comprise:
phase offsets between the multiple phases and the calibration signal;
amplitude offsets between the second plurality of digital output segments and the calibration signal; or
DC offsets between the second plurality of digital output segments and the calibration signal.

22. The multi-lane ADC of claim 1, wherein the known characteristic comprises:
a known amplitude;
a known direct current (DC) offset; or
a known phase.

23. The multi-lane ADC of claim 1, wherein the calibration signal is characterized as having a single frequency to quantify the impairments present within the single frequency.

24. The multi-lane ADC of claim 1, wherein the calibration signal is characterized as having multiple frequencies to quantify the impairments present within the multiple frequencies.

25. The multi-lane ADC of claim 1, further comprising:
a second switching module configured to select the analog input to be converted by the plurality of ADCs in the first mode of operation or the calibration signal to be converted by the plurality of ADCs in the second mode of operation.

26. The multi-lane ADC of claim 1, wherein the first mode of operation is a normal mode of operation, and
wherein the second mode of operation is a calibration mode of operation.

27. The multi-lane ADC of claim 1, wherein the impairment detection module is further configured to provide a plurality of impairment correction signals based upon the statistical relationships, and further comprising:
a phase adjustment module configured to adjust a phase of one of the multiple phases based upon a corresponding first one of the plurality of impairment correction signals; and
a gain/offset adjustment module configured to adjust an amplitude and a direct current (DC) offset of one of the first plurality of digital output segments in the first mode of operation or one of the second plurality of digital output segments in the second mode of operation based upon a corresponding one of the plurality of impairment correction signals.

\* \* \* \* \*